US012482599B2

(12) United States Patent
Polivka et al.

(10) Patent No.: US 12,482,599 B2
(45) Date of Patent: Nov. 25, 2025

(54) CORE ASSEMBLIES FOR MAGNETIC SATURATION DETECTOR WITHOUT REQUIREMENT FOR BIAS CURRENT

(71) Applicant: POWER INTEGRATIONS, INC., San Jose, CA (US)

(72) Inventors: William M. Polivka, Campbell, CA (US); Fatemeh-Sohila Hamdad, San Jose, CA (US)

(73) Assignee: POWER INTEGRATIONS, INC., San Jose, CA (US)

( * ) Notice: Subject to any disclaimer, the term of this patent is extended or adjusted under 35 U.S.C. 154(b) by 762 days.

(21) Appl. No.: 17/622,178

(22) PCT Filed: Aug. 17, 2020

(86) PCT No.: PCT/US2020/046621
§ 371 (c)(1),
(2) Date: Dec. 22, 2021

(87) PCT Pub. No.: WO2021/034746
PCT Pub. Date: Feb. 25, 2021

(65) Prior Publication Data

US 2022/0359117 A1 Nov. 10, 2022

Related U.S. Application Data

(60) Provisional application No. 62/888,194, filed on Aug. 16, 2019.

(51) Int. Cl.
*H01F 27/28* (2006.01)
*G01R 33/12* (2006.01)
(Continued)

(52) U.S. Cl.
CPC ....... *H01F 27/402* (2013.01); *G01R 33/1215* (2013.01); *H01F 27/24* (2013.01); *H01F 27/306* (2013.01)

(58) Field of Classification Search
CPC ...... H01F 27/402; H01F 27/24; H01F 27/306; H01F 3/14; G01R 33/1215; G01R 33/12; G01R 33/16
(Continued)

(56) References Cited

U.S. PATENT DOCUMENTS

| | | | |
|---|---|---|---|
| 3,226,639 | A | 12/1965 | Will |
| 3,403,323 | A | 9/1968 | Kent |

(Continued)

FOREIGN PATENT DOCUMENTS

| | | | |
|---|---|---|---|
| CN | 1154721 | A | 7/1997 |
| CN | 2453528 | Y | 10/2001 |

(Continued)

OTHER PUBLICATIONS

Esser A: "Contactless Charging and Communication for Electric Vehicles", vol. 1, No. 6, Nov. 1, 1995 (Nov. 1, 1995), 1077-2618, figures 1,2; 8 pages.

(Continued)

*Primary Examiner* — Shawki S Ismail
*Assistant Examiner* — Kazi S Hossain

(57) ABSTRACT

Magnetic core assemblies include a skewing feature that introduces transverse components into the power flux density vector are disclosed herein. A magnetic core assembly comprises a lower core having a center section and an upper core having a center section. The center sections are aligned to form a center post. A power winding that receives current is wrapped around the center post. The core assembly further comprises a power flux density vector that has transverse and non-transverse components. The transverse components have a higher magnetic reluctance than the non-transverse components. When the assembly is used with a transverse winding, the transverse components from the magnetic core assembly produce a transverse voltage waveform on the (Continued)

transverse winding. The transverse voltage waveform may be observed to detect a change in the sign of the slope of the transverse voltage waveform. The change in the sign of the slope indicates magnetic saturation.

17 Claims, 15 Drawing Sheets

(51) Int. Cl.
*H01F 27/24* (2006.01)
*H01F 27/30* (2006.01)
*H01F 27/40* (2006.01)

(58) Field of Classification Search
USPC .......................................... 336/210, 221, 83
See application file for complete search history.

(56) References Cited

U.S. PATENT DOCUMENTS

| | | | | |
|---|---|---|---|---|
| 3,739,257 | A | 6/1973 | Hunter | |
| 4,020,440 | A | 4/1977 | Moerman | |
| 4,103,221 | A * | 7/1978 | Fukui | H01F 7/021 323/362 |
| 4,206,434 | A | 6/1980 | Hase | |
| 4,277,751 | A | 7/1981 | Lawson et al. | |
| 4,295,838 | A | 10/1981 | Richards et al. | |
| 4,307,334 | A | 12/1981 | Peil et al. | |
| 4,439,822 | A | 3/1984 | Cocconi | |
| 4,459,653 | A | 7/1984 | Smith | |
| 4,583,156 | A | 4/1986 | Forge | |
| 4,791,542 | A | 12/1988 | Piaskowski | |
| 4,853,668 | A | 8/1989 | Bloom | |
| 4,994,952 | A | 2/1991 | Silva et al. | |
| 5,166,597 | A | 11/1992 | Larsen et al. | |
| 5,317,300 | A | 5/1994 | Boesel | |
| 5,440,225 | A * | 8/1995 | Kojima | H01F 3/14 336/178 |
| 5,446,346 | A | 8/1995 | Nilssen | |
| 5,534,837 | A | 7/1996 | Brandt | |
| 5,737,203 | A | 4/1998 | Barrett | |
| 5,757,184 | A | 5/1998 | Kurihara et al. | |
| 6,194,897 | B1 | 2/2001 | Fukunaga | |
| 6,208,531 | B1 | 3/2001 | Vinciarelli et al. | |
| 6,370,043 | B1 | 4/2002 | Yasumura | |
| 6,380,735 | B1 | 4/2002 | Kawakami | |
| 6,490,180 | B2 | 12/2002 | Hiltunen et al. | |
| 6,639,499 | B2 * | 10/2003 | Okita | H01F 29/146 336/212 |
| 7,646,281 | B2 * | 1/2010 | Diekmann | H01F 38/085 336/234 |
| 8,253,299 | B1 | 8/2012 | Rittenhouse | |
| 8,610,533 | B2 | 12/2013 | Nussbaum | |
| 2003/0020428 | A1 | 1/2003 | Masaki et al. | |
| 2003/0052671 | A1 | 3/2003 | Kawase | |
| 2009/0230776 | A1 | 9/2009 | Ochi et al. | |
| 2009/0322165 | A1 | 12/2009 | Rittenhouse | |
| 2010/0085138 | A1 * | 4/2010 | Vail | H01F 3/14 336/216 |
| 2010/0195353 | A1 | 8/2010 | Nishiyama et al. | |
| 2011/0032683 | A1 | 2/2011 | Li et al. | |
| 2012/0257421 | A1 | 10/2012 | Brkovic | |
| 2013/0320940 | A1 | 12/2013 | Dimitrovski | |
| 2014/0185337 | A1 | 7/2014 | Espino | |
| 2014/0218012 | A1 | 8/2014 | Umetani | |
| 2015/0008757 | A1 | 1/2015 | Scholz et al. | |
| 2016/0358705 | A1 | 12/2016 | Lin et al. | |
| 2021/0313895 | A1 | 10/2021 | Schaible | |
| 2022/0311324 | A1 | 9/2022 | Sato et al. | |

FOREIGN PATENT DOCUMENTS

| | | | | |
|---|---|---|---|---|
| CN | 103460309 | A | | 12/2013 |
| CN | 106405260 | A | | 2/2017 |
| DE | 102013009587 | A1 | | 12/2013 |
| GB | 2042277 | A | | 9/1980 |
| JP | H07130554 | A | | 5/1995 |
| JP | 2005191256 | A | | 7/2005 |
| JP | 2010027946 | A | * | 2/2010 |
| JP | 2017098415 | A | | 6/2017 |
| RU | 2168230 | C2 | | 5/2001 |
| WO | 2014061113 | A1 | | 4/2014 |
| WO | 2018158339 | A1 | | 9/2018 |

OTHER PUBLICATIONS

PCT Application No. PCT/US2020/046612; International Search Report and Written Opinion of the International Searching Authority; Oct. 28, 2020; 11 pages.
PCT Application No. PCT/US2020/046617; International Search Report and Written Opinion of the International Searching Authority; Oct. 30, 2020; 9 pages.
PCT Application No. PCT/US2020/046621; International Search Report and Written Opinion of the International Searching Authority; Nov. 20, 2020; 16 pages.
Sonja Klopper et al: "A Sensor for Balancing Flux in Converters with a High-Frequency Transformer Link", vol. 33, No. 3, Jun. 1, 1997; 6 pages.
Machine Translation of DE102013009587; Klopcic Beno, et al., "Measuring device for detecting saturation of magnetic core of transformer in direct current static converter", 6 pages.
Machine Translation of JP2010027946; Sakita Koichi, "Magnetic Core", 7 pages.
U.S. Appl. No. 17/619,903, Non-Final Office Action mailed Jan. 22, 2025; 16 pages.
U.S. Appl. No. 17/620,057, Non-Final Office Action mailed Nov. 13, 2024; 16 pages.
Chinese Application Serial No. 202080056726.0, First Office Action and Search Report with Machine Translation, Aug. 29, 2024, 16 pages.
Chinese Patent Application No. 202080056816.X; "First Office Action, Search Report with Machine Translation"; mailed Nov. 11, 2024, 10 pages.
PCT Application Serial No. PCT/US2020/046612, International Preliminary Report On Patentability, issued Feb. 17, 2022, 7 pages.
PCT Application Serial No. PCT/US2020/046617, International Preliminary Report On Patentability, issued Feb. 17, 2022, 6 pages.
PCT Application Serial No. PCT/US2020/046621, International Preliminary Report On Patentability, issued Feb. 17, 2022, 12 pages.
Chinese Application Serial No. 202080056726.0, Second Office Action Issued Feb. 25, 2025, and Search Report Dated Feb. 22, 2025, with Machine Translation, 17 pages in all.
Chinese Application Serial No. 202080056805.1, First Office Action Issued Jan. 15, 2025, and Search Report Dated Jan. 13, 2025, with Machine Translation, 10 pages in all.
U.S. Appl. No. 17/620,057, Notice of Allowance mailed Feb. 7, 2025; 16 pages.
U.S. Appl. No. 17/619,903; "Notice of Allowance Mailed Apr. 23, 2025"; 17 pages.
CN Application No. 202080056726.0; "Decision on Rejection with Machine Translation"; mailed Jun. 30, 2025; 15 pages.
Polivka, William M. (1984) Applications of Magnetics to Problems in Switched-Mode Power Conversion. Dissertation (Ph.D.), California Institute of Technology, 273 pages in all.
W. M. Polivka, A. Cocconi, and S. Cuk, "Detection of Magnetic Saturation in Switching Converters," Advances in Switched-Mode Power Conversion, vol. III, Pasadena, CA: TESLAco, 1983, pp. 103-118.
W. Polivka, A. Cocconi, and S. Cuk, "Use of Orthogonal Flux to Detect Impending Magnetic Saturation in Switching Converters, " Advances in Switched-Mode Power Conversion, vol. III, Pasadena, CA: TESLAco, 1983, pp. 119-149.
S. Kirli, K. D. T. Ngo, W. M. Polivka and M. M. Walters, "Inductance modeling for a mode-2 perforated-plate matrix inductor/transformer," Proceedings of IEEE Power Electronics Specialist Conference—PESC '93, Seattle, WA, USA, 1993, pp. 1130-1136.

(56) References Cited

OTHER PUBLICATIONS

E. Osegueda, K. D. T. Ngo, W. M. Polivka and M. M. Walters, “Perforated-plate magnetics. I. Mode-1 inductor/ transformer,” in IEEE Transactions on Aerospace and Electronic Systems, vol. 31, No. 3, Jul. 1995, pp. 968-976.

S. Kirli, K. D. T. Ngo, W. M. Polivka and M. M. Walters, “Perforated-plate magnetics. II. Mode-2 inductor/transformer,” in IEEE Transactions on Aerospace and Electronic Systems, vol. 31, No. 3, Jul. 1995, pp. 977-986.

* cited by examiner

1200

CORE ASSEMBLIES FOR MAGNETIC SATURATION DETECTOR WITHOUT REQUIREMENT FOR BIAS CURRENT

This application is a National Stage Entry of International Application No. PCT/US2020/046621 filed on Aug. 17, 2020, which claims the benefit of U.S. Provisional Application No. 62/888,194, filed Aug. 16, 2019, the contents of which are incorporated in their entirety herein by reference.

RELATED APPLICATIONS

This patent application is related to patent application 62/887,810, entitled, “Magnetic Saturation Detector with Single and Multiple Transverse Windings,” and to patent application 62/888,089, entitled, “Energy Transfer Element Including A Communication Element,” each of which is filed on even date herewith, each of which is assigned to the common assignee, and each of which has one common inventor. Each of the Related Applications is incorporated herein by reference in its entirety.

BACKGROUND OF THE INVENTION

1. Field of the Invention

The disclosure describes embodiments of magnetic core assemblies for an inductive element, useful for providing a voltage on a transverse winding of the inductive element. The voltage may be monitored to produce a signal that directly indicates the onset of magnetic saturation in the inductive element, without the need for a bias current in the transverse winding.

2. Discussion of the Related Art

Efforts have been made to enable a flyback power supply, or other power product that comprises an inductive energy transfer element, to deliver maximum output power by extending the available flux density of its coupled inductor to include the saturation flux density under a variety of electrical and thermal conditions.

Known applications use a transverse winding of an inductive element to detect impending magnetic saturation by processing a voltage signal that appears between the terminals of the transverse winding. A control circuit may respond to the voltage signal on the transverse winding to operate the power supply safely near the maximum available flux density of the magnetic material.

A shortcoming of previous implementations of a transverse winding to detect impending magnetic saturation is that they require current in a transverse winding. The current produces a transverse magnetic field that changes in response to the saturation characteristics of the magnetic material. The changing transverse magnetic field is accompanied by a changing electric field that is observed as a voltage between the terminals of the transverse winding. The need to provide a bias current in a transverse winding increases complexity of the circuits, reduces efficiency of the power supply, and typically adds cost to the product. Therefore, there is a need for an innovation that produces a signal that directly indicates magnetic saturation without the shortcomings described above.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
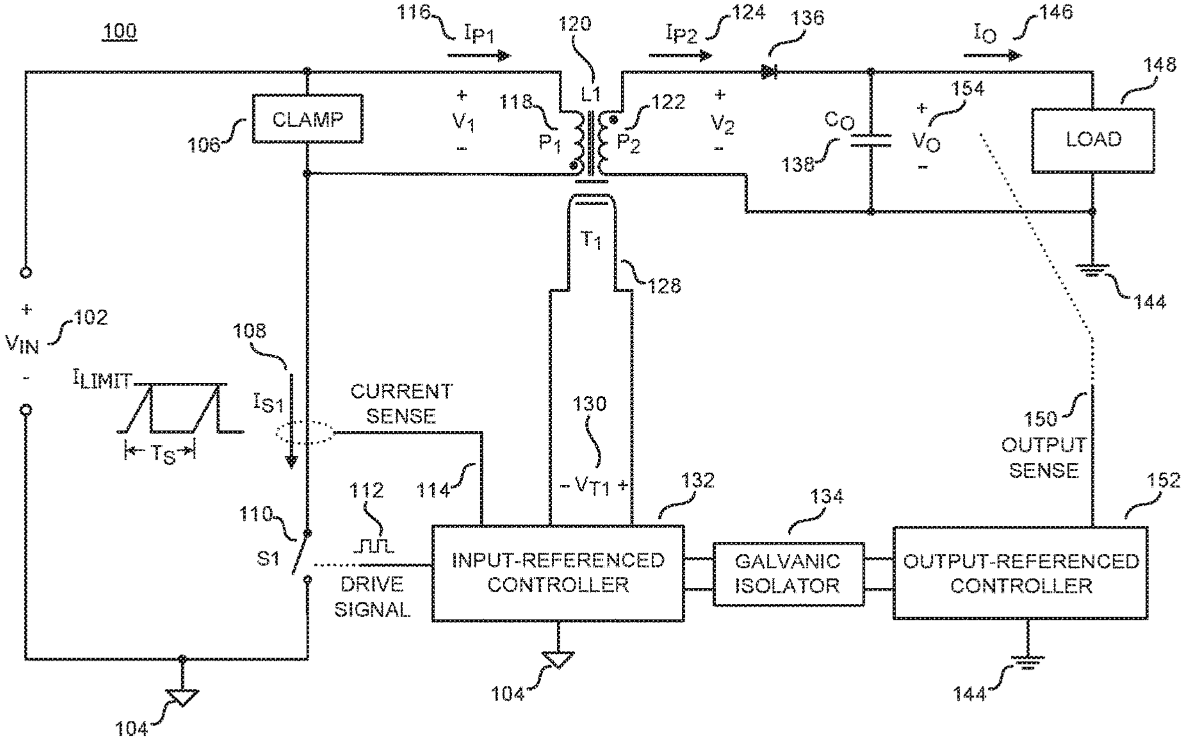
FIG. 1 is a schematic diagram of an example power supply that includes a switched mode power converter with a magnetic saturation detector in accordance with embodiments of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

FIG. 1 is a schematic diagram 100 of an example power supply configured to operate with a magnetic saturation detector that uses a single transverse winding that requires no bias current in the transverse winding. The example power supply of FIG. 1 receives an input voltage $V_{IN}$ 102 with respect to an input return 104 and provides a regulated output to a load 148. The regulated output may be a voltage $V_O$ 154 with respect to an output return 144, a current $I_O$ 146, or a combination of both.

The example power supply of FIG. 1 uses a flyback power converter to produce an output that is galvanically isolated from the input. In other words, a voltage applied between the input return 104 and the output return 144 would produce negligible current. The flyback power converter in the example power supply of FIG. 1 includes an energy transfer element L1 120 that has an input power winding $P_1$ 118, output power winding $P_2$ 122, and single transverse winding $T_1$ 128. Power windings $P_1$ 118 and $P_2$ 122 take part principally in the transfer of energy between the input and the output, whereas transverse winding $T_1$ 128 takes part in the detection of magnetic saturation. A clamp circuit 106 is coupled across the input power winding $P_1$ 118. An input switch S1 110 is coupled between the input power winding $P_1$ 118 and the input return 104.

In operation, an input-referenced controller 132 receives signals from an output-referenced controller 152 through a galvanic isolator 134 to produce a drive signal 112 that opens and closes the input switch S1 110. An open switch cannot conduct current, whereas a closed switch may conduct current. The input-referenced controller 132 senses current $I_{S1}$ 108 in the input switch S1 110 as a current sense signal 114. In one mode of operation, input-referenced controller 132 may open input switch S1 110 when the current $I_{S1}$ 108 reaches a threshold value. In another mode of operation, the input-referenced controller 132 may open input switch S1 110 when energy transfer element L1 120 reaches a state of impending magnetic saturation.

The switching of switch S1 110 produces pulsating currents $I_{P1}$ 116 and $I_{P2}$ 124 in the respective power windings $P_1$ 118 and $P_2$ 122 of energy transfer element L1 120, as well as pulsating voltages $V_1$ and $V_2$ across those respective windings. Clamp circuit 106 prevents excess voltage on input power switch S1 110 when the switch opens. Output winding current $I_{P2}$ 124 from output power winding $P_2$ 122 is rectified by diode 136 and filtered by output capacitor $C_O$ 138 to produce an output voltage $V_O$ 154 and an output current $I_O$ 146 at a load 148. Either the output voltage $V_O$ 154, the output current $I_O$ 146, or a combination of both may be sensed as an output sense signal 150 by the output-referenced controller 152. The output-referenced controller compares the sensed output quantity to a reference value, and may communicate with the input-referenced controller 132 through a galvanic isolator circuit 134 to switch the input switch S1 110 appropriately to obtain the desired output values. The galvanic isolator circuit 134 may include any of the many known ways use to use optical, magnetic, and capacitive technologies to couple signals between galvanically isolated circuits.

In the example power supply of FIG. 1, transverse winding $T_1$ 128 may respond to a transverse magnetic flux density within energy transfer element L1 120, producing transverse voltage $V_{T1}$ 130 on transverse winding $T_1$ 128 to indicate magnetic saturation.

Figure 2:
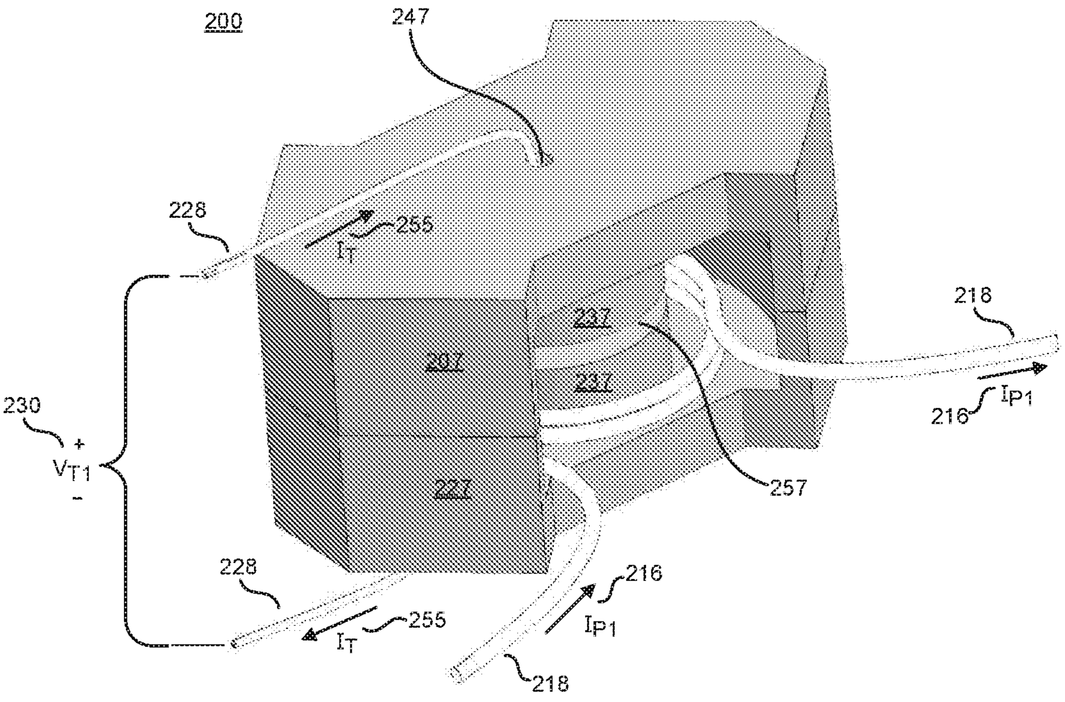
FIG. 2 (PRIOR ART)
FIG. 2 is a perspective drawing of an example energy transfer element that uses an example magnetic core assembly with a transverse winding that requires a bias current to detect magnetic saturation.

FIG. 2 is a perspective drawing 200 that illustrates the salient features of an example energy transfer element with similarities to an energy transfer element that may be used in the example power supply of FIG. 1. The example energy transfer element in FIG. 2 is constructed from two RM-style ferrite core-pieces. An upper core member, e.g. upper core-half 207, is assembled over a lower core member, e.g. lower core-half 227. Each magnetic core-half has a center post 225 surrounded by a winding 218 that represents one or more power windings, such as $P_1$ 118 and $P_2$ 122 in FIG. 1. In a practical component the turns of the power windings typically would be placed on a separate spool, sometimes referred to as a bobbin or a coil former, that would fit over the center posts to facilitate assembly. FIG. 2 shows a gap 257 in the center post of the assembled core-halves. The dimension of the gap is typically selected along with the number of turns on the power windings to set the electrical parameters desired for a particular application. In some applications, the gap contains a permanent magnet to provide a flux density offset to the flux density produced by current in a power winding. The gap may be achieved either with identical top and bottom core-halves having center posts of the same length, or with one core-half that has a center post shorter than the center post of the other core-half. Alternatively, a spacer consisting of an electrically insulating material with relatively low magnetic permeability may be inserted between identical core-halves to distribute the gap among the three vertical structural features. A gap in the center post is immaterial to the detection of magnetic saturation. As such, illustrations in this disclosure may show structures with and without gaps in a center post to emphasize that a gap in a center post is not required to practice the invention.

FIG. 2 also shows a transverse winding 228 that passes through an aperture 247 in the center post 237 of each core-half such that the transverse winding is perpendicular to the power winding 218. The aperture 247 in the center of the center post of each core-half is an off-the-self option in some offerings of RM-style cores that come with a center hole that accommodates a ferrite slug to adjust the inductance of the power winding after assembly. Transverse windings 228 may traverse the adjustment hole in place of the ferrite slug to provide for a magnetic saturation detector in accordance with the teaching of this invention. Other styles of ferrite cores may have apertures for other purposes, such as for example assembly hardware, that may be suitable for a transverse winding. In cores that do not come with a suitable aperture, a hole may be drilled through the center post. It is appreciated that a transverse winding need not be geometrically perpendicular to the power winding. Any conductor that passes completely through a turn of a power winding in one direction at any angle may be a transverse winding.

The transverse winding is typically a single turn, although a transverse winding may include more than one turn to amplify the voltage $V_{T1}$ 230 on the winding that is produced by a changing transverse flux density as the magnetic material of the core begins to saturate. The example of FIG. 2 shows a transverse current $I_T$ 255 that introduces a transverse flux density to detect magnetic saturation. The alternative core assemblies described in this disclosure do not require the transverse current $I_T$ 255 to detect magnetic saturation.

It will be appreciated by those skilled in the art that magnetic assemblies and parts of magnetic assemblies may be described by various terms that are not necessarily technically accurate nor precise. For example, virtually any piece of magnetic material may be referred to as a magnetic core. A complete assembly of pieces of magnetic components exclusive of windings may also typically be referred to as a magnetic core. Assemblies of magnetic cores typically comprise two core pieces. In many assemblies of magnetic cores, such as in the example of FIG. 2, the two core pieces may be nearly identical. Hence, each piece may be commonly referred to as a core member or core-half. In practice, the gap in a center post, such as the gap 257 in the assembly of FIG. 2 for example, may be formed by removing material from the center post of only one of two identical core-halves. Each piece is still referred to as a core-half even though the piece that forms the gap is no longer identical to the piece that had no material removed. The assembly may be further referred to as a core pair. In this disclosure the term core-half may be used to refer to one of two nearly identical pieces in an assembly to distinguish the assembly from alternative assemblies comprising pieces that are obviously not identical. For example, an assembly of two E-shaped pieces may have the same geometrical features and magnetic properties as an assembly that uses one E-shaped piece with one I-shaped piece. The EE assembly comprises two core-halves whereas the EI assembly does not, although each assembly comprises two core members. It is noted that in the practice of the art each one of a magnetic core piece, a magnetic core member, a magnetic core element, a magnetic core-half, and a magnetic core assembly may be referred to as a magnetic core.

Figure 3:
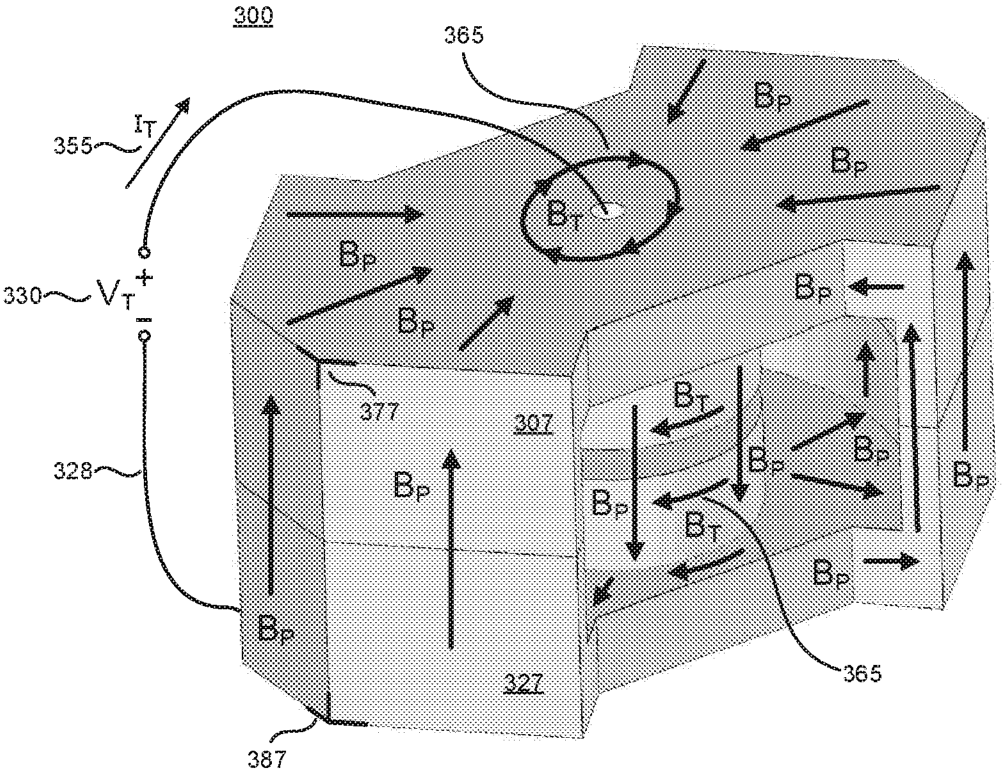
FIG. 3 (Prior Art)
FIG. 3 is an annotated perspective drawing of the example magnetic core assembly of FIG. 2 showing paths of flux densities from current in a power winding and from current in a transverse winding.

FIG. 3 is a perspective drawing 300 of the structure of FIG. 2 showing an upper core-half 307 and a lower core-half 327 with no windings. Reference marks 377 and 387 highlight identical features on the upper core-half 307 and lower core-half 327 respectively that are useful in discussion of the relative positions of the two core-halves. The windings are removed in FIG. 3 to avoid obscuring annotations of flux density vectors. A power winding encircling the center post and conducting current, such as for example winding 218 and current $I_{P1}$ 216 in FIG. 2, would produce a power flux density $B_P$ within the assembly as illustrated by the vectors $B_P$ annotated in FIG. 3. A current $I_T$ 355 in a transverse winding represented schematically by the path 328 would produce a transverse flux density represented by vectors $B_T$ 365 that are perpendicular to the power flux density vectors $B_P$ in the center post and in most parts of the assembly outside the center post. Furthermore, contributions from transverse components of the power flux density $B_P$ in the upper half-core 307 are cancelled by contributions from transverse components of the power flux density $B_P$ in the lower half-core 327, so that the net contribution with respect to the path 328 is zero. In other words, the geometry of the assembly is such that vectors $B_P$ of power flux density are orthogonal to vectors $B_T$ 355 of transverse flux density with respect to the path of a transverse winding. As such, changes in power flux density $B_P$ produce negligible voltage on a transverse winding. The transverse current $I_T$ 355 is typically constant to introduce constant transverse magnetic field that produces a transverse flux density $B_T$. The transverse flux density $B_T$ is forced to change as the magnetic material begins to saturate. As the vector sum of the power flux density $B_P$ and the transverse flux density $B_T$ increases to reach a saturation flux density of the magnetic core, further increase in power flux density $B_P$ forces a change in transverse flux density $B_T$ that produces a transverse voltage $V_T$ 330 between the terminals of a conductor in the path 328. The transverse voltage $V_T$ 330 may be processed and interpreted to detect the onset of magnetic saturation.

Figure 4:
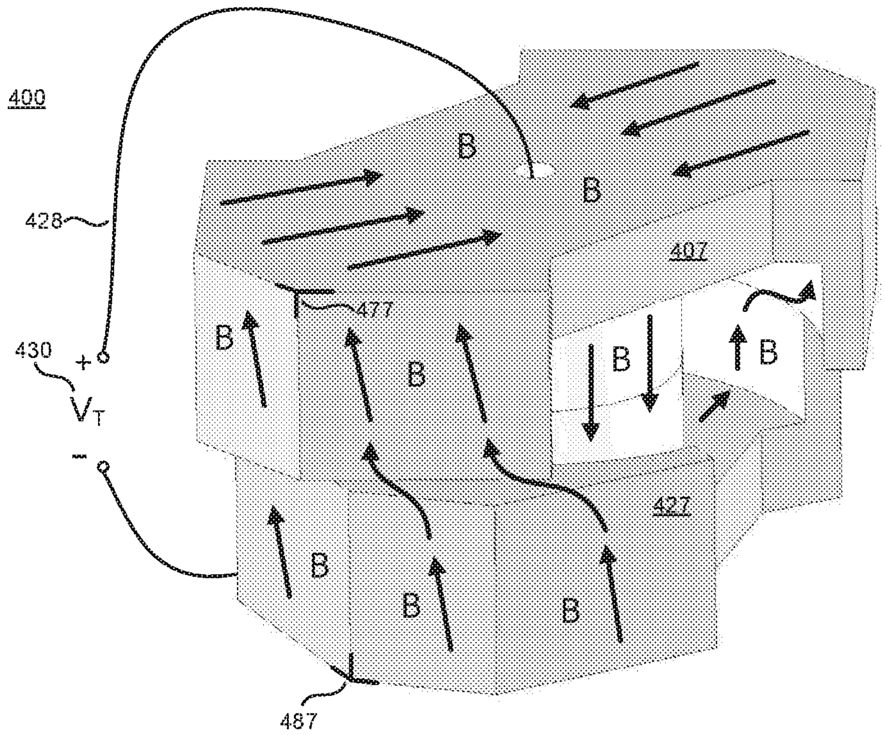
FIG. 4. is an annotated perspective drawing of an example magnetic core assembly including a representation of a transverse winding that does not require a bias current in the transverse winding to detect magnetic saturation.

FIG. 4 is an annotated perspective drawing 400 illustrating an example magnetic core assembly that does not require a bias current in a transverse winding to detect magnetic saturation. The example of FIG. 4 does not show a power winding nor a gap in the center post to avoid distracting from the essential features of the invention. The examples in FIG. 3 and FIG. 4 both use RM-style ferrite core-halves. In the example of FIG. 4, the upper core-half 407 is rotated approximately 30 degrees clockwise about its center when viewed from the top with respect to the lower core-half 427. The rotational offset of FIG. 4 is in contrast to the traditional assembly depicted in FIG. 3 that has vertical edges of the upper and lower core-halves aligned such that the vertical edges are collinear and the flat vertical faces are co-planar. The displacement in FIG. 4 may be gauged also by the locations of the reference marks 477 and 487 that correspond to the respective features highlighted by the reference marks 377 and 387 in FIG. 3. The reference marks 477 and 487 are not vertically aligned in FIG. 4 while in the traditional assembly in FIG. 3, the reference marks 377 and 387 are vertically aligned. The rotational displacement between the two core-halves may be considered a skewing feature in the assembly of the magnetic cores that allows a magnetic saturation detector to determine the onset of magnetic saturation by monitoring the voltage on a transverse winding in the absence of a current in a transverse winding.

FIG. 4 shows flux density vectors B with both horizontal and vertical components in the vertical sides of the structure even though there is no transverse current to introduce a transverse magnetic field into the assembly. The rotational offset between the upper core-half 407 and the identical lower core-half 427 introduces transverse components in the flux density vectors B. The geometry of the assembly of FIG. 4 ensures that for any orientation of a transverse winding in the path 428 that passes through the aperture in the center post, there will be a net magnetic flux density passing through the surface bounded by the conductor that is the transverse winding. That is, there will be a net magnetic flux density passing through the loop formed by the transverse winding when the transverse winding has no current. A change in the transverse component of flux density will produce a voltage between the terminals of the transverse winding. In other words, a change in the transverse component of flux density induces a non-zero transverse voltage $V_T$ 430 on a transverse winding that may be processed to indicate impending magnetic saturation. The saturation characteristics of the magnetic material of the energy transfer element produce features in the waveform of the transverse voltage $V_T$ 430 that allow detection of magnetic saturation during the operation of a power supply.

Figure 5A:
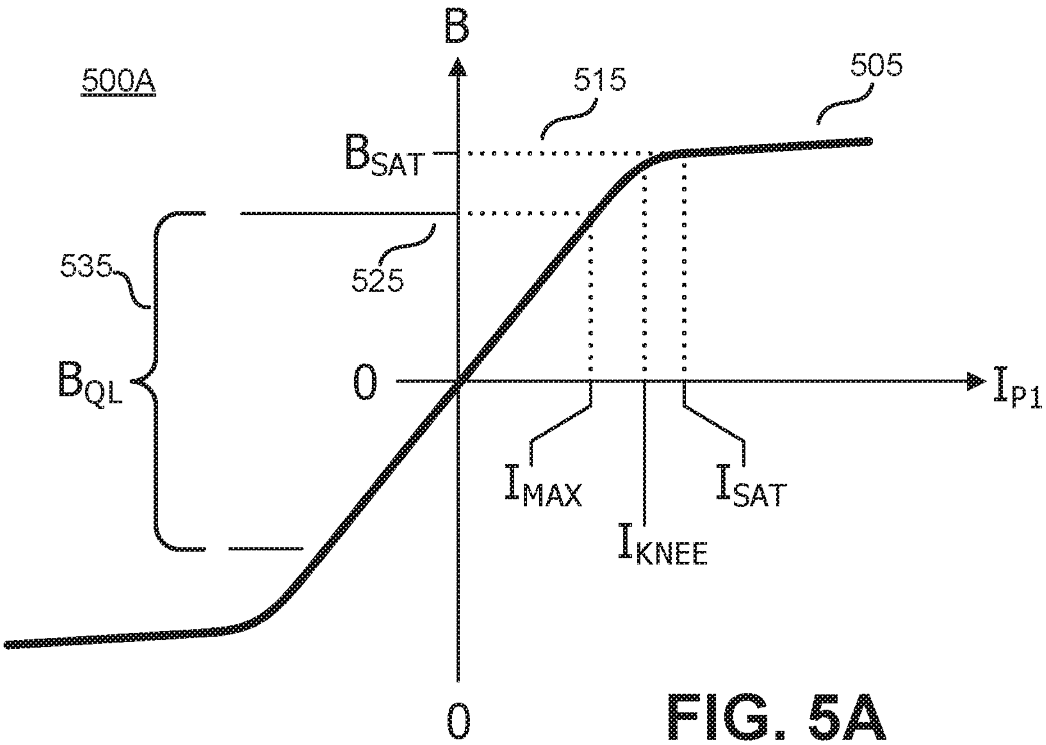
FIG. 5A is a graph of magnetic flux density in an example magnetic energy transfer element with respect to the current in a power winding of the energy transfer element, in accordance with embodiments of the present disclosure.
Figure 5B:
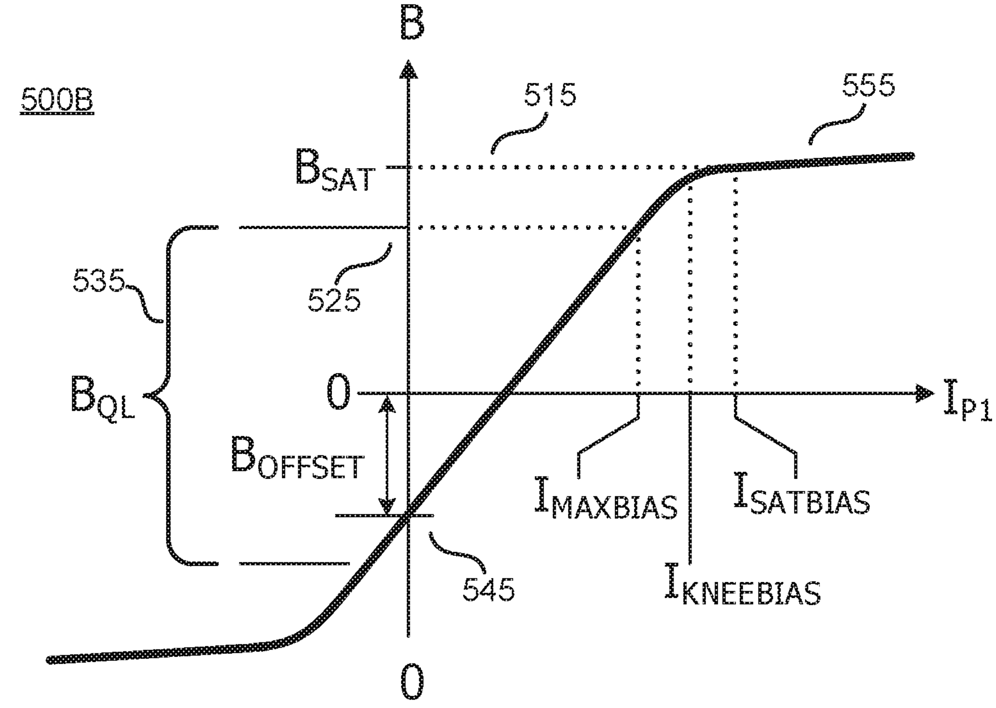
FIG. 5B is a graph of magnetic flux density in an example magnetic energy transfer element with respect to the current in a power winding of the energy transfer element when the energy transfer element includes a permanent magnet to provide an offset flux density, in accordance with embodiments of the present disclosure.

FIG. 5A and FIG. 5B graphically illustrate the relationships between magnetic flux density in an energy transfer element and the current in a power winding of the energy transfer element. FIG. 5A is a graph 500A that shows magnetic flux density plotted on the vertical axis with respect to a power winding current such as for example $I_{P1}$ 116 in the power supply of FIG. 1 on the horizontal axis. More accurately, the horizontal axis represents the sum of the ampere turns of all power windings, not just the current in a single power winding. The example energy transfer element for the graph of FIG. 5A has no flux density offset from a permanent magnet, so the flux density is at zero when the current is at zero.

The magnetic flux density curve 505 in FIG. 5A highlights several distinguishing features. The curve 505 takes on positive and negative values with symmetry about the origin on both axes. There is positive flux density for positive current and negative flux density for negative current. Features are emphasized for positive values of current in the graph because the current in the example circuit of FIG. 1 is in only one direction. As the current $I_{P1}$ increases from zero, the energy transfer element operates in a quasi-linear region $B_{QL}$ 535 until the current reaches a maximum value $I_{MAX}$ that corresponds to the upper boundary 525 of the quasi-linear region. The slope of the curve 505 in the quasi-linear region 535 is positive and relatively constant. In other words, the flux density increases with increasing current at a nearly constant ratio. As the current increases beyond $I_{MAX}$, the slope of the flux density curve 505 decreases, reaching a lower relatively constant value for currents greater than a saturation current $I_{SAT}$ that corresponds to a saturation flux density $B_{SAT}$ 515. It is important to detect operation at the saturation flux density $B_{SAT}$ 515 because operation at higher values of flux density is likely to produce current that may damage switching devices and other components in a power supply. As the slope of the curve 505 changes from its nearly constant value in the quasi-linear region $B_{QL}$ 535 where the current is less than $I_{MAX}$ to its much lower nearly constant value where the current is greater than $I_{SAT}$, there is region where the slope is changing rapidly between the two relatively constant values. The current between $I_{MAX}$ and $I_{SAT}$ where the slope of the flux density is changing most rapidly is identified as $I_{KNEE}$ since it corresponds to the relatively sharp bend in the flux density curve 505. A magnetic saturation detector may indicate operation at the flux density corresponding to current $I_{KNEE}$ so that operation at currents greater than $I_{SAT}$ may be avoided.

FIG. 5B is a graph 500B that shows magnetic flux density plotted on the vertical axis with respect to a power winding current such as for example $I_{P1}$ 116 in the power supply of FIG. 1 on the horizontal axis. In contrast to the graph of FIG. 5A, the example energy transfer element for the graph of FIG. 5B has a flux density offset from a permanent magnet.

The flux density offset from the permanent magnet shifts the curve 505 of FIG. 5A to the right on the horizontal axis as shown by the curve 555 in FIG. 5B. The values on the vertical axis for the saturation flux density $B_{SAT}$ 515 and the quasi-linear region $B_{QL}$ 535 are unchanged because they are intrinsic properties of the magnetic material of the core. A flux density offset can change the relationship between the flux density and an external stimulus, but it cannot change the intrinsic properties of the magnetic material. The flux density offset from a permanent magnet, such as for example one that may be placed in the gap 257 of the assembly illustrated in FIG. 2, is shown in FIG. 5B as $B_{OFFSET}$ that produces a negative flux density 545 in the energy transfer element when the current $I_{P1}$ on the horizontal axis is zero.

The flux density offset increases the values of the current $I_{P1}$ required to reach the upper boundary 525 of the quasi-linear region $B_{QL}$ 535, the saturation value $B_{SAT}$ 515, and the flux density where the slope of the curve is changing most rapidly. In other words, currents $I_{MAX}$, $I_{SAT}$, and $I_{KNEE}$ of FIG. 5A are respectively increased to $I_{MAXBIAS}$, $I_{SATBIAS}$, and $I_{KNEEBIAS}$ in FIG. 5B. Therefore, in energy transfer elements that use a permanent magnet to provide a flux density offset, the magnetic saturation detector may indicate operation at the flux density corresponding to current $I_{KNEEBIAS}$ so that operation at currents greater than $I_{SATBIAS}$ may be avoided.

Figure 6:
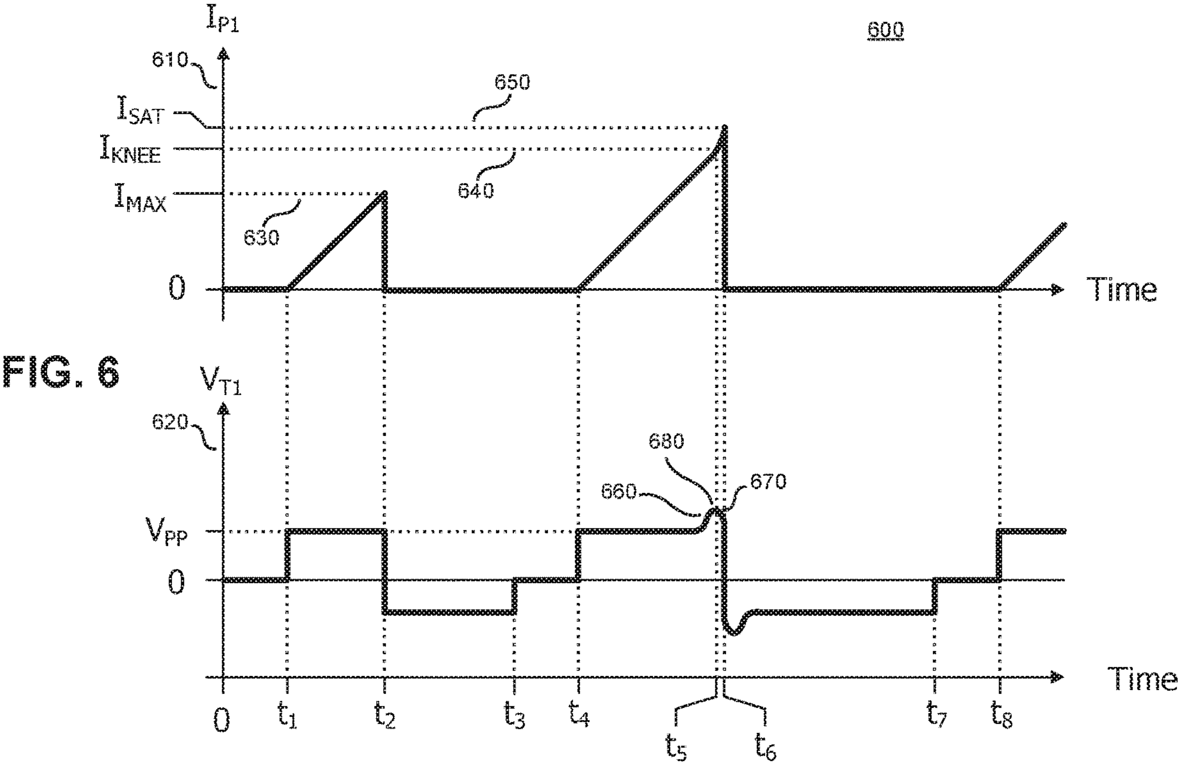
FIG. 6 is a graph showing the waveform of current in a power winding of an energy transfer element with the waveform of voltage on a transverse winding of the energy transfer element, in accordance with embodiments of the present disclosure.

FIG. 6 is a graph 600 that shows a waveform of current in a power winding and a waveform of voltage on a transverse winding from an example energy transfer element that may operate in the example power supply of FIG. 1. Current $I_{P1}$ 116 is plotted on the vertical axis 610 and transverse voltage $V_{T1}$ 130 is plotted on vertical axis 620, both with respect to time on the horizontal axis.

The current is the result of the input voltage $V_{IN}$ 102 across power winding $P_1$ 118 of energy transfer element L1 120 when switch S1 110 closes and opens. The transverse voltage $V_{T1}$ 130 on transverse winding $T_1$ 128 arises from a mechanism that exploits the magnetic saturation characteristic of the magnetic material to produce a voltage on a transverse winding.

The saturation characteristic describes the behavior of the total flux density that is produced by current in a power winding. The flux density is in general not uniform throughout a magnetic core assembly. The flux densities in some parts of the assembly may be greater than flux densities in other parts of the assembly. Therefore, some parts of the assembly may reach the saturation flux density before other parts of the assembly reach the saturation flux density.

In an ordinary magnetic core assembly that has an aperture in a center post such as the aperture 247 in the example of FIG. 3, the vectors of flux density from current in a power winding are generally perpendicular to the vectors of flux density from current in a transverse winding.

As shown by the example of FIG. 4, the geometry of the magnetic core assembly may be configured to rotate the vector of the total flux density so that the magnetic flux density vector may contain two components, even when the flux density is within the quasi-linear region. The vectors of the two components of the flux density are perpendicular to each other in the magnetic material. One of the components may be a transverse component that induces a voltage in a transverse winding.

Flux density vectors must follow closed paths. The geometry of the magnetic core assembly forces the transverse component of the flux density vector to take a path of higher magnetic reluctance than the path of the flux density vector that is perpendicular to it. An increase in current in the power winding forces the sum of the two components of flux density to increase in magnitude, even when the total flux density is near the saturation value. As the material saturates, its reluctance to the flux density increases. The flux density in the material along the lower reluctance path is higher than the flux density in the material along the higher reluctance path. Since the saturation characteristic imposes a limit on the increase of the sum of the two vectors, the vector with the higher magnitude on the lower reluctance path will increase at a lower rate than the vector with the lower magnitude along the higher reluctance path. The result is an effective additional rotation of the flux density vector that increases the component of flux density in the transverse direction, producing a rapid increase in the voltage $V_{T1}$ between the terminals of the transverse winding.

When the total flux density is in the quasi-linear region ($B_{QL}$ 555 in FIG. 5A and FIG. 5B), the transverse flux density is approximately proportional to the principal flux density, and voltage on the power windings produces a voltage on the transverse windings that is approximately proportional to the voltages on the power windings, represented in FIG. 6 as the voltage $V_{PP}$ while the power winding is conducting current. Since the voltage $V_{PP}$ is approximately proportional to the voltage on the power windings, it is a known value that may be taken into consideration when processing the transverse voltage $V_{T1}$ to detect magnetic saturation. Alternatively, magnetic saturation may be determined in a manner that ignores the presence of $V_{PP}$, such as for example by detecting a change in the sign of the slope of the $V_{T1}$ while the current $I_{P1}$ is increasing. Thus, features of the time-varying voltage on the transverse winding may be interpreted to detect magnetic saturation in the energy transfer element.

To produce the example waveforms of FIG. 6, switch S1 110 in the example power supply of FIG. 1 closes at time $t_1$. Between time $t_1$ and time $t_2$, current $I_{P1}$ increases from zero to the value $I_{MAX}$ 630, and the flux density increases from zero to the upper boundary 525 of the quasi-linear region $B_{QL}$ 535 of the flux density characteristic shown in FIG. 5A when input-referenced controller 132 opens the switch. When switch S1 110 opens at time $t_2$, current in power winding $P_1$ 118 goes from $I_{MAX}$ to zero while current in power winding $P_2$ 122 increases from zero to a value required to maintain the flux density that corresponds to current $I_{MAX}$ in winding power winding $P_1$ 118. The transverse voltage $V_{T1}$ changes polarity at time $t_2$ because the changing flux density that produces the voltage on the windings decreases after the switch opens, whereas the flux density increases while the switch is closed. In the example of FIG. 6, the currents in the power winding $P_2$ 122 decreases to zero at time $t_3$ between time $t_2$ and time $t_4$. The voltage remains at zero between time $t_3$ and time $t_4$ since the flux density is not changing in that interval.

When switch S1 110 closes again at time $t_4$, current $I_{P1}$ again increases from zero, rising to exceed both $I_{MAX}$ 630 and $I_{KNEE}$ 640, reaching $I_{SAT}$ 650 before the input-referenced controller 132 opens the switch. As the increasing current $I_{P1}$ exceeds $I_{MAX}$ 630, the flux density leaves the quasi-linear range $B_{QL}$ 535, and transverse voltage $V_{T1}$ rapidly becomes more positive with a substantial positive slope 660. The transverse voltage $V_{T1}$ attains a maximum positive value 680 at time $t_5$ that corresponds to current $I_{P1}$ at $I_{KNEE}$ 640. The transverse voltage $V_{T1}$ becomes less positive with a substantial negative slope 670 as current $I_{P1}$ passes through $I_{KNEE}$ and approaches its final value of $I_{SAT}$ 650 at time $t_6$, where input-referenced controller 132 opens the switch. Transverse voltage $V_{T1}$ becomes more negative and reaches a maximum negative value as the current in the power windings decreases to zero at time $t_7$ between time $t_6$ and time $t_8$.

Figure 7:
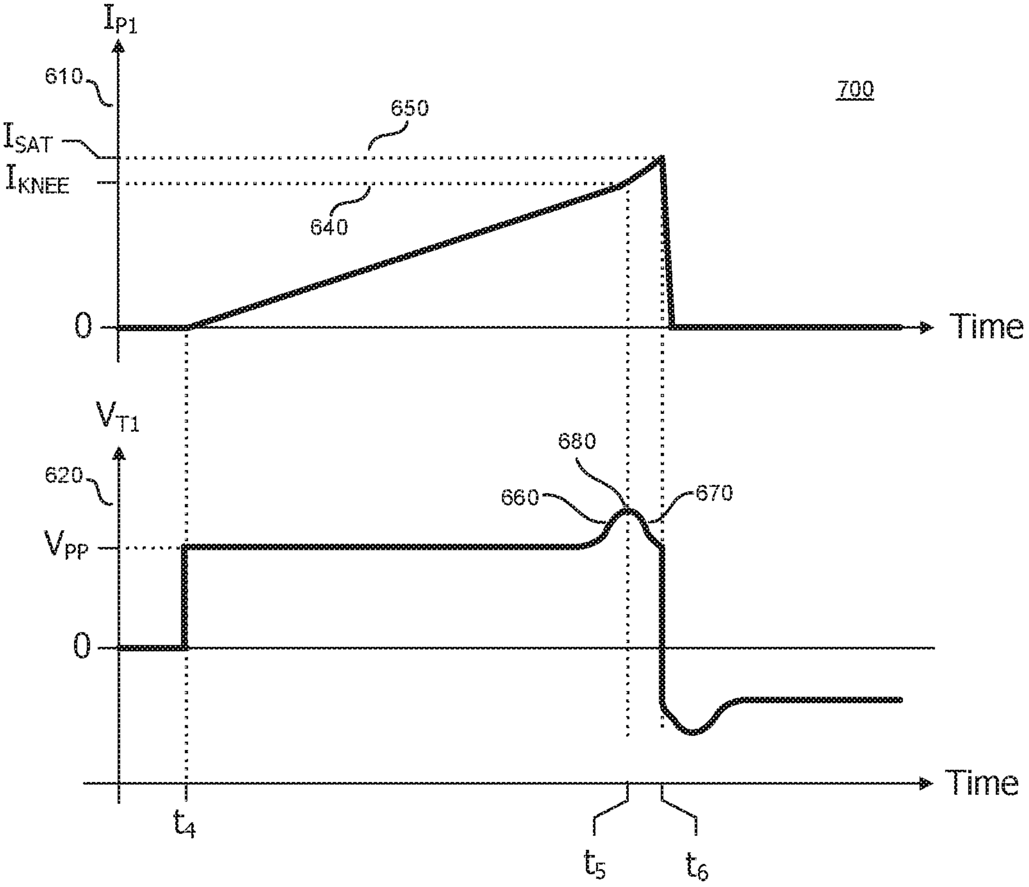
FIG. 7 is an expanded portion of the graph of FIG. 6 showing greater detail, in accordance with embodiments of the present disclosure.

FIG. 7 is an expanded view 700 of the waveforms in FIG. 6 showing greater detail near times $t_5$ and $t_6$. The expansion emphasizes the characteristics of the transverse voltage waveform that allow a circuit to detect magnetic saturation from observation of the voltage on a transverse winding.

FIG. 7 shows an extremum 680 in the waveform of the transverse voltage $V_{T1}$ when current $I_{P1}$ is at the value $I_{KNEE}$ 640. Although the extremum 680 is a peak in the example of FIG. 7, the polarity of the voltage on the transverse winding may be reversed simply by interchanging the two ends of the winding at the voltage sensing terminals or by reversing the direction of the angular displacement between the upper and lower core-halves in the assembly by turning the upper core-half anticlockwise instead of clockwise with respect to the lower core-half when viewed from the top to make the extremum a valley instead of a peak.

A characteristic of the extremum that is independent of the polarity is the change in the sign of the slope of the waveform from before the time $t_5$ to after the time $t_5$. FIG. 7 shows a positive slope on the portion 660 before $t_5$ and a negative slope on the portion 670 after $t_5$. The change in sign of the slope of the voltage on the transverse winding is an indication of magnetic saturation. If the polarity of the transverse winding were reversed, the slope would be negative before $t_5$ and positive after $t_5$. The change in sign of the slope is also independent of the magnitude of the extremum. Since the slope of the transverse voltage waveform changes sign, either going from positive to negative or going from negative to positive, the slope of the transverse voltage waveform must pass through a value of zero. Therefore, a zero-crossing detector that observes the slope of the voltage on the transverse winding may detect magnetic saturation. A controller that opens a switch in a power winding in response to a zero-crossing detector that senses the voltage on a transverse winding may control a power supply to operate at its maximum power capability without damage. In practice, to avoid false indications of magnetic saturation, the zero-crossing detector may be gated to observe the voltage on the transverse winding only after the switch has been closed for a threshold time or only when the current in the switch is greater than a threshold current.

The preceding examples have illustrated the application of a magnetic saturation detector in a power supply with a power converter that operates in discontinuous conduction mode (DCM). That is, in each switching period the current in the power windings and the flux density in the energy transfer element (with no flux density offset) start at a value of zero and end at a value of zero. In contrast, under different conditions of input voltage, output voltage, and load, a power supply may operate its power converter in continuous conduction mode (CCM). That is, in CCM the current in the power windings and the flux density (again with no flux density offset in the energy transfer element) does not start and end at a value of zero in each switching period. The operation of the magnetic saturation detector in CCM is the same as the operation in DCM when in each CCM switching period the flux density starts and ends within the quasi-linear region $B_{QL}$ 535.

Consider that the flux density with a transverse component takes a path of a greater distance, and therefore higher reluctance, than the path of flux density that has no transverse component. Hence, before saturation the flux density with transverse components will be lower in magnitude than the flux density without transverse components. The part of the magnetic core assembly with the lower-reluctance path and higher flux density begins to saturate first. Saturation increases reluctance. The growing reluctance diverts additional increase in flux density to the transverse path that is not yet saturated, increasing the voltage $V_T$. When there is saturation in both paths, the transverse component of flux density increases at a lower rate, causing $V_T$ to decrease.

Figure 8:
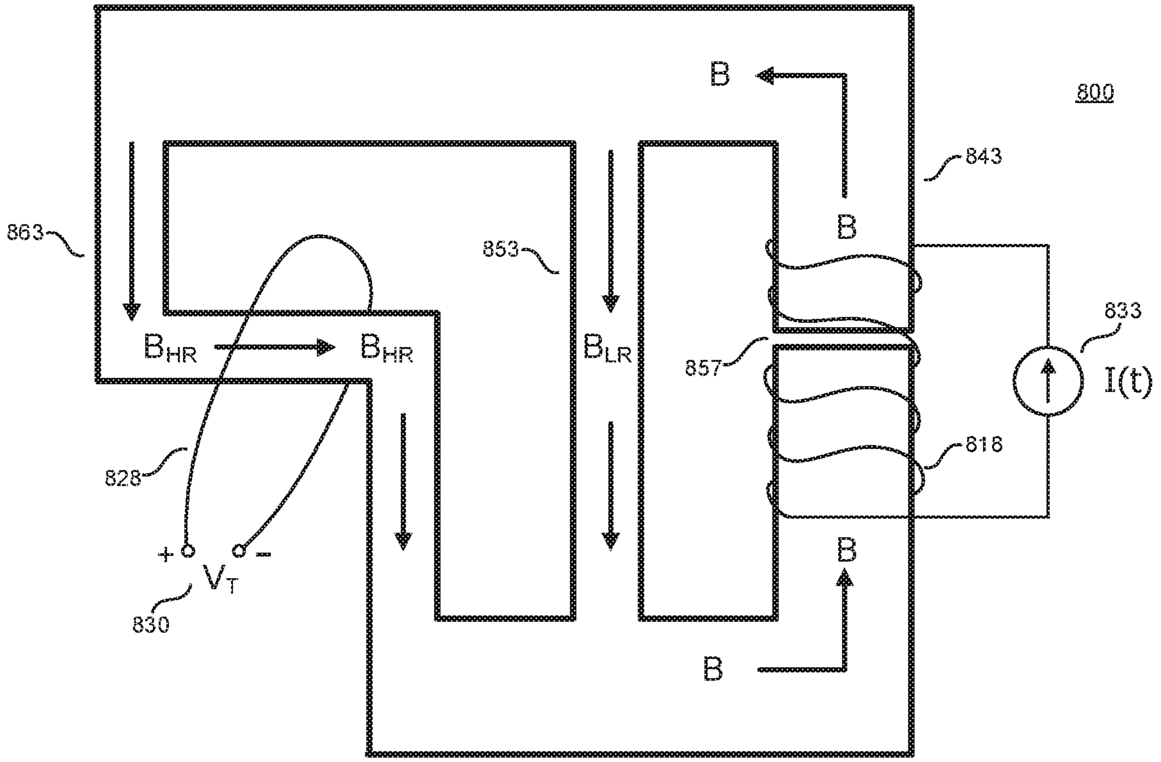
FIG. 8 is a planar model of a magnetic core assembly for a magnetic saturation detector that does not require a bias current in a transverse winding in accordance with embodiments of the present disclosure.

FIG. 8 is a planar model 800 of a magnetic core assembly for a magnetic saturation detector that does not require a bias current in a transverse winding. The model is useful to explain the waveforms of FIG. 6 and FIG. 7. One portion of the model represents a center post 843 with a gap 857, wrapped with a power winding 813 that is driven by a time-varying current I(t) from a current source 833. The magnetic field from the current in the power winding produces a flux density B in the center post. A second portion of the model represents a lower-reluctance path 853 for a flux density $B_{LR}$. A third portion of the model represents a transverse path of higher reluctance 863 for a transverse flux density $B_{HR}$ that may induce a transverse voltage $V_T$ 830 in a transverse winding 828. Flux density B from the magnetic field in the center post 843 divides into flux densities $B_{LR}$ and $B_{HR}$. The flux density $B_{LR}$ in the lower-reluctance path will be larger than the flux density $B_{HR}$ in the higher-reluctance transverse path if the core material is in its quasi-linear region. The portion of the core with higher flux density will saturate before the portion of the core with lower flux density. As the lower-reluctance path 853 begins to saturate, its reluctance increases, shifting more of the total flux density B to the higher-reluctance path 863, and increasing the voltage $V_T$ 830 on transverse winding 828.

Figure 9:
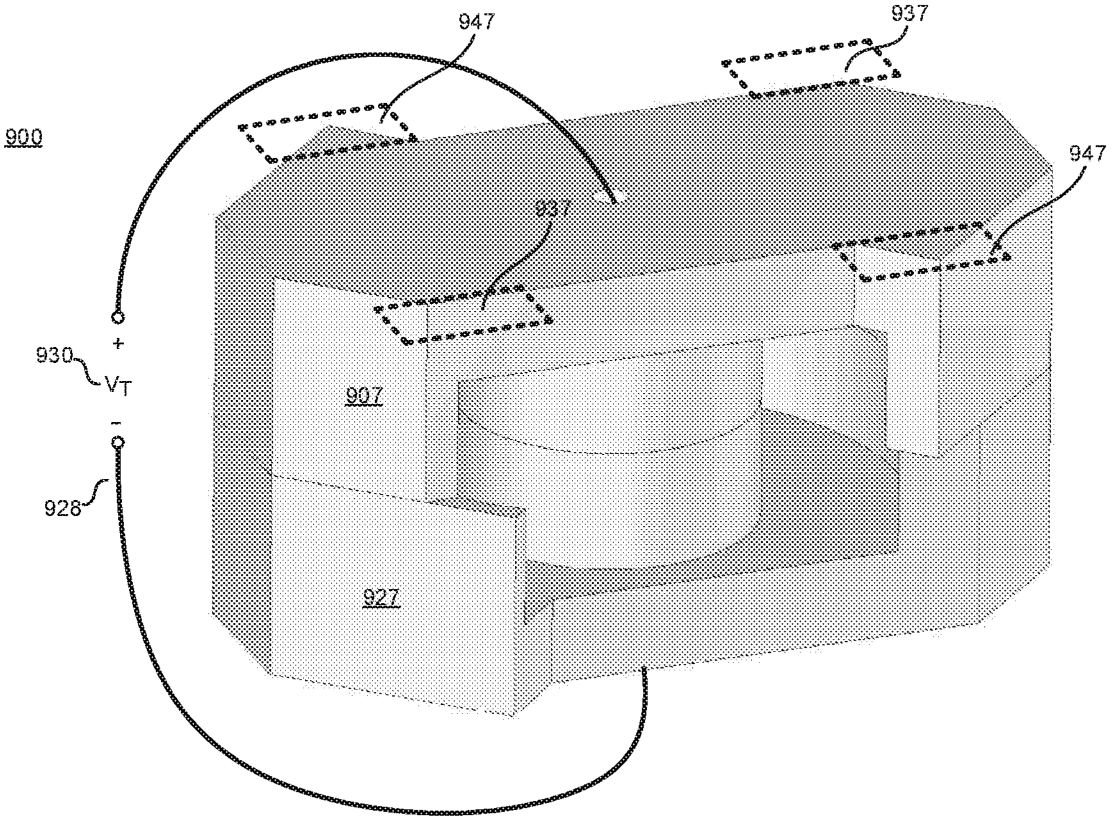
FIG. 9 is a perspective drawing of another example magnetic core assembly with a transverse winding that does not require a bias current in the transverse winding to detect magnetic saturation in accordance with the embodiments of the present disclosure.

FIG. 9 is a perspective drawing 900 of another example magnetic core assembly with a transverse winding 928 that does not require a bias current in the transverse winding to detect magnetic saturation. As in FIG. 4, the gap in the center post and power windings around the center post are not shown in FIG. 9 to avoid obscuring features of the invention. In contrast to the example of FIG. 4, the example of FIG. 9 has no rotational offset between the upper core-half 907 and the lower core-half 927: the vertical edges of the upper and lower core-halves are aligned such that the vertical edges are collinear and the flat vertical faces are co-planar. Both core-halves in FIG. 9 are modified from the standard RM-style shown in FIG. 4 by the removal of material from each core-half. FIG. 9 shows regions 937 in the upper core-half 907 where material that formed features in the standard configuration has been removed. Those standard features are still present in the regions 947. The lower core-half is identical to the upper core-half. The removal of material also removes a degree of symmetry in the geometry of the assembly to introduce a component of transverse flux density that produces a transverse voltage $V_T$ 930 on the transverse winding 928 when there is voltage on a power winding that encircles the center post. The removal of material from standard core-halves may be considered a skewing feature in the assembly of the magnetic cores that allows a magnetic saturation detector to determine the onset of magnetic saturation by monitoring the voltage on a transverse winding in the absence of a current in a transverse winding.

Figure 10:
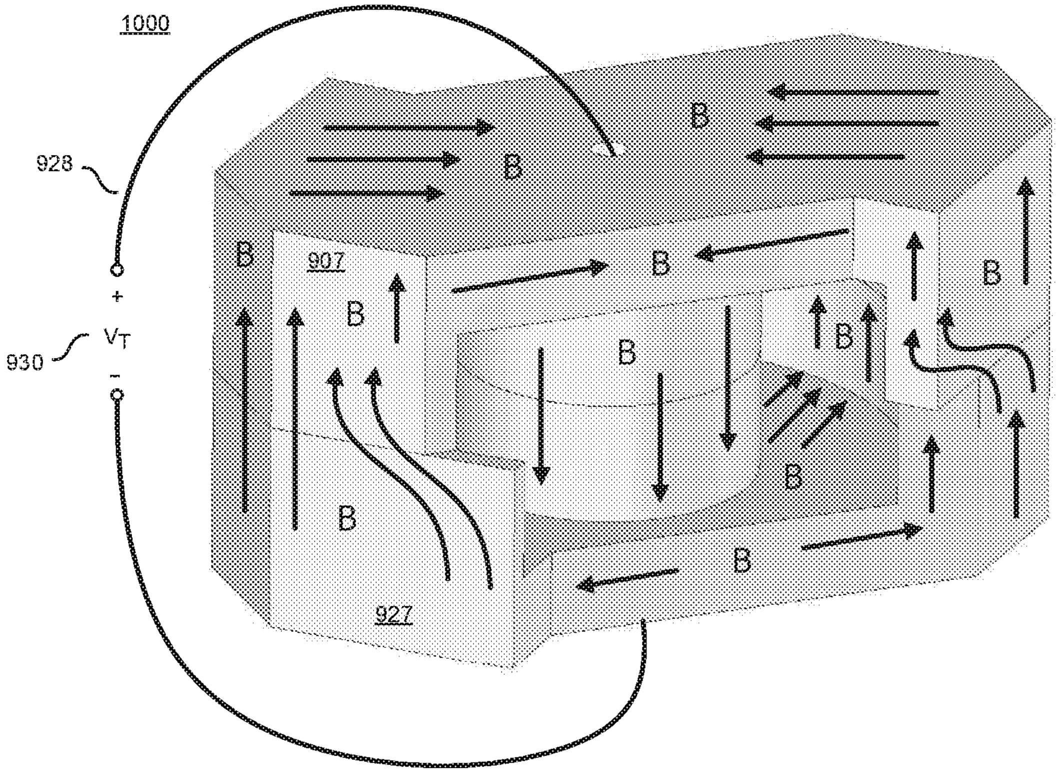
FIG. 10 is an annotated perspective drawing of the example magnetic core assembly of FIG. 9 showing paths of flux densities from current in a power winding in accordance with the embodiments of the present disclosure.

FIG. 10 is an annotated perspective drawing 1000 of the example magnetic core assembly of FIG. 9 showing paths of flux densities from current in a power winding. As in FIG. 9, the gap in the center post and power windings around the center post are not shown in FIG. 10 to avoid obscuring features of the invention.

FIG. 10 shows flux density vectors B with both horizontal and vertical components in the vertical sides of the structure even though there is no transverse current to introduce a transverse magnetic field into the assembly. The asymmetry in the assembly introduced by removal of material from upper and lower core-halves introduces transverse components in the flux density vectors B, similar to the rotational offset shown in the example of FIG. 4. As in the example configuration of FIG. 4, the geometry of the assembly of FIG. 10 ensures that for any orientation of a transverse winding 928 that passes through the aperture in the center post, there will be a net magnetic flux density passing through the surface bounded by the conductor that is the transverse winding. That is, there will be a net magnetic flux density passing through the loop formed by the transverse winding when the transverse winding has no current. A change in the transverse component of flux density will produce a voltage between the terminals of the transverse winding. The geometry of the example assembly of FIG. 10 also creates a path of higher magnetic reluctance for the transverse component of flux density with respect the non-transverse component of flux density. In other words, a change in the transverse component of flux density induces a non-zero transverse voltage $V_T$ 930 on a transverse winding that may be processed to indicate impending magnetic saturation. The saturation characteristics of the magnetic material of the energy transfer element produce features in the waveform of the transverse voltage $V_T$ 930 that allow detection of magnetic saturation during the operation of a power supply.

Figure 11:
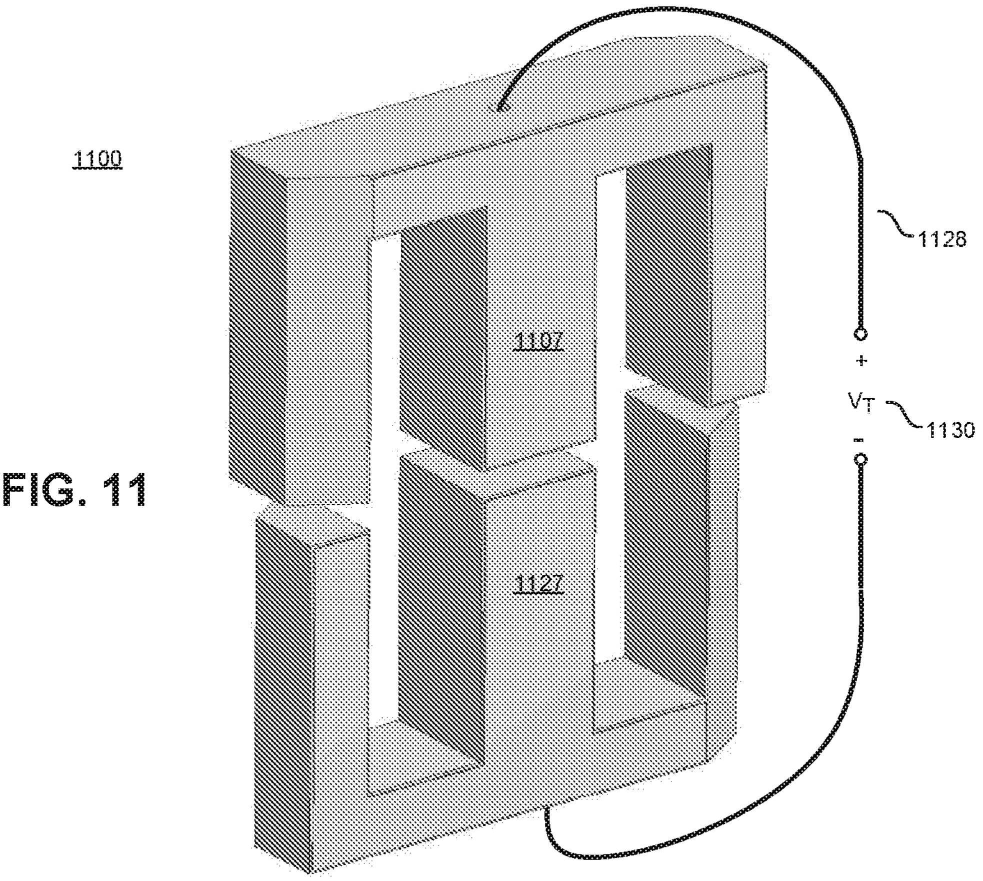
FIG. 11 is a perspective drawing of yet another example magnetic core assembly with a transverse winding that does not require a bias current in the transverse winding to detect magnetic saturation in accordance with the embodiments of the present disclosure.

FIG. 11 is a perspective drawing 1100 of yet another example magnetic core assembly with a transverse winding 1128 that does not require a bias current in the transverse winding to detect magnetic saturation. FIG. 11 shows an upper core-half 1107 and a lower core-half 1127 that have modifications to a standard EE-style geometry. In FIG. 11 the core-halves are separated, and the windings are not shown to give better visibility to the features of the geometry. In practice, the upper and lower core-halves would be in contact, and the center post may include a gap. There is also a hole drilled through the center post to form an aperture that accommodates the transverse winding 1128.

The example of FIG. 11, one corner is removed from each outer leg of each core-half. Two corners that are farthest apart in a top view of the standard half-core geometry are removed. The two core-halves are assembled with an orientation such that a leg with a full corner mates with a leg that has a corner removed.

Figure 12:
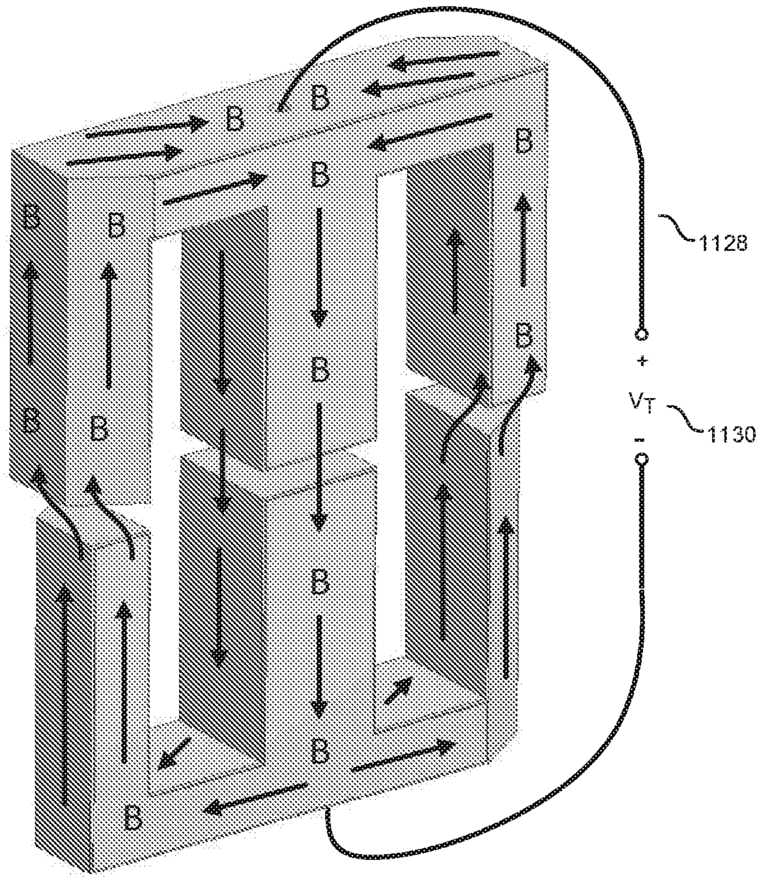
FIG. 12 is an annotated perspective drawing of the example magnetic core assembly of FIG. 11 showing paths of flux densities from current in a power winding in accordance with the embodiments of the present disclosure.

FIG. 12 is an annotated perspective drawing 1200 of the example magnetic core assembly of FIG. 11 showing paths of flux densities from current in a power winding. As in FIG. 10, FIG. 12 shows flux density vectors B with both horizontal and vertical components in the vertical sides of the structure even though there is no transverse current to introduce a transverse magnetic field into the assembly. The asymmetry in the assembly introduced by removal of material from upper and lower core-halves introduces transverse components in the flux density vectors B, similar to the rotational offset shown in the example of FIG. 4. As in the previous examples, the transverse components of flux density produce a transverse $V_T$ 1130 that may be processed to detect magnetic saturation. It will be appreciated that variants of the standard EE-style, such as for example the common EI-style, may be modified by removal of material from the E-piece and the I-piece as suggested by FIG. 11, where the I-piece is analogous to the plate that is common to the center and outer legs of each core-half.

Figure 13:
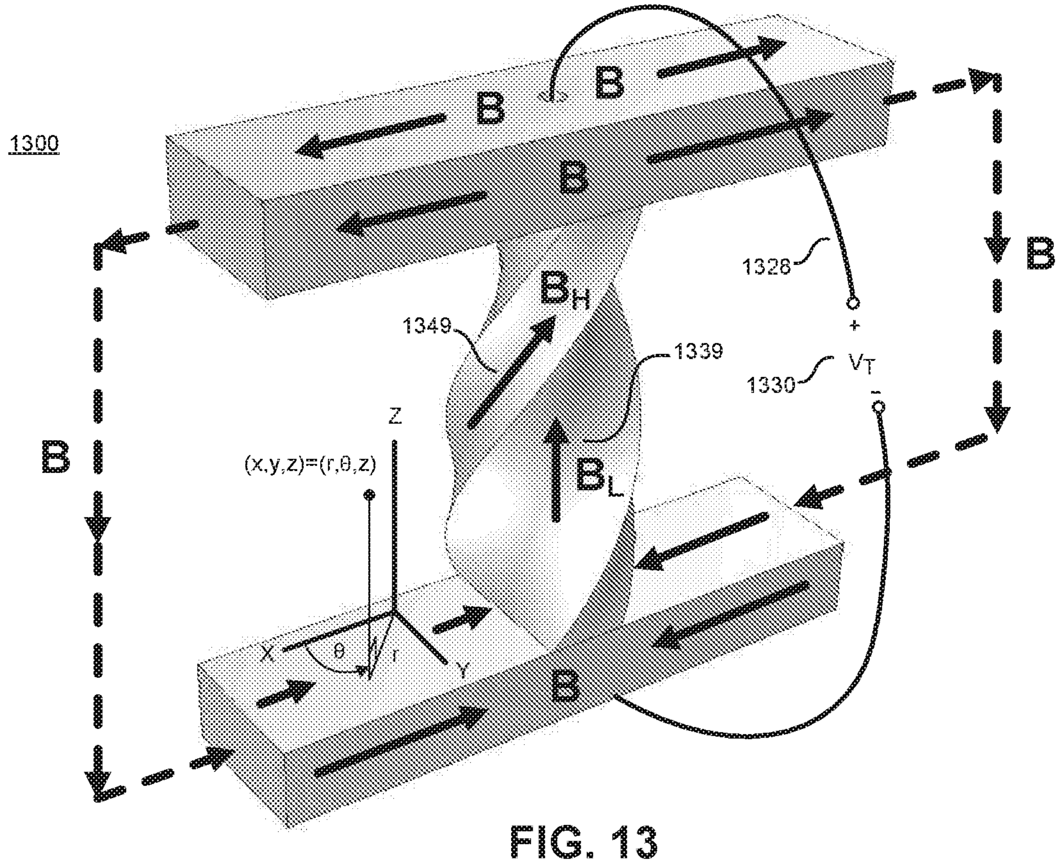
FIG. 13 is an annotated perspective drawing of a portion of a magnetic core assembly with emphasis on a center post showing paths of flux densities from current in a power winding in accordance with the embodiments of the present disclosure.
Figure 14:
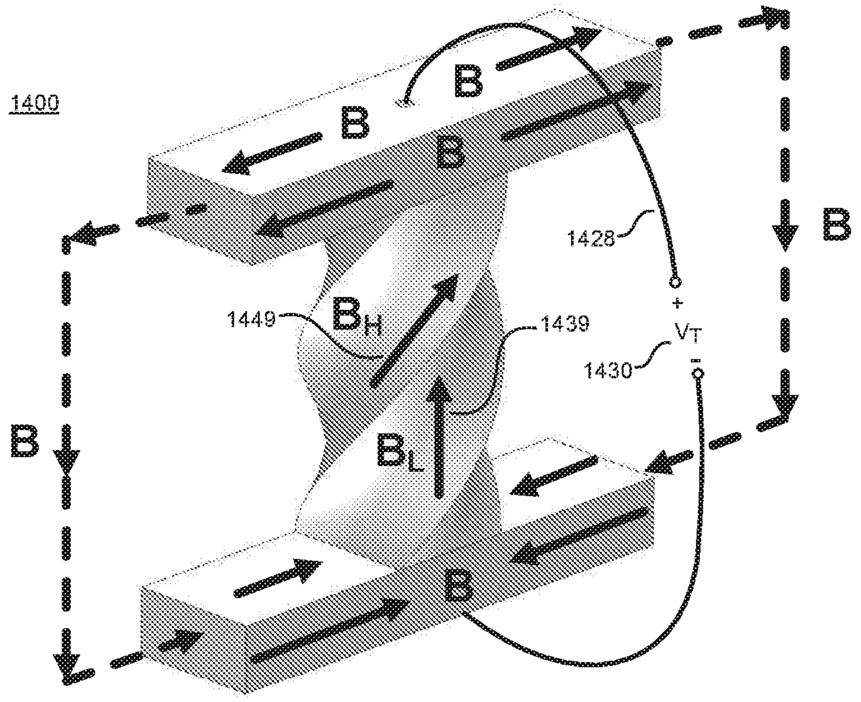
FIG. 14 is an annotated perspective drawing of a portion of another magnetic core assembly with emphasis on a center post showing paths of flux densities from current in a power winding in accordance with the embodiments of the present disclosure.
Figure 15:
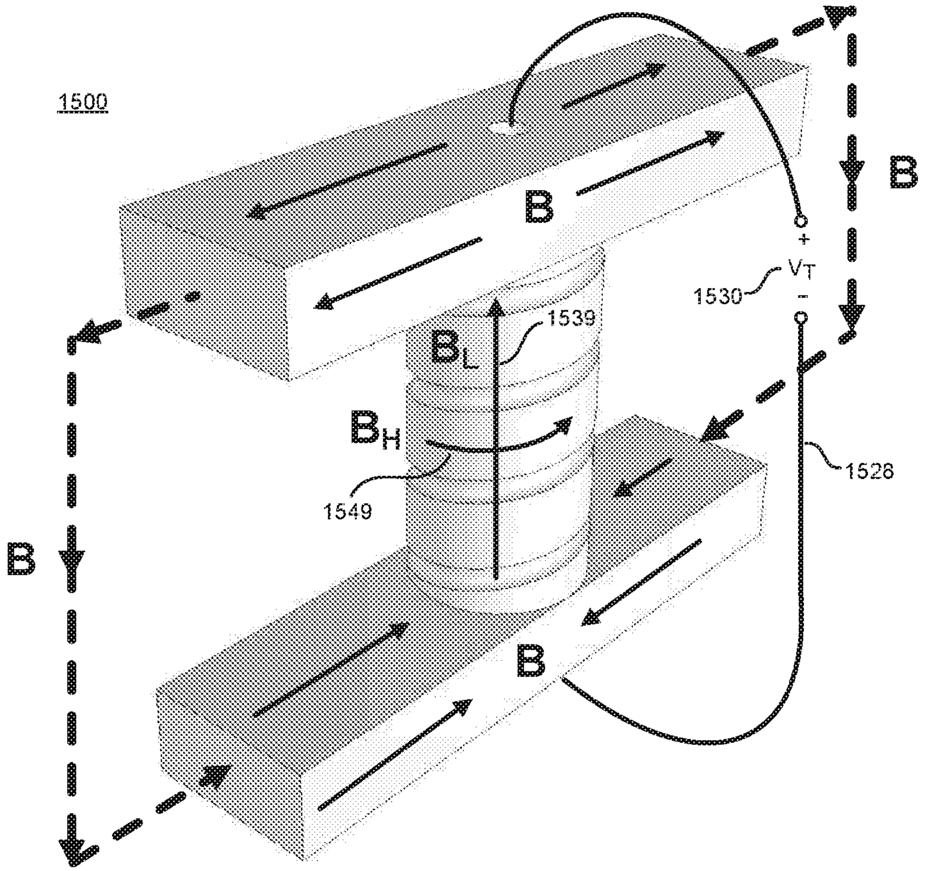
FIG. 15 is an annotated perspective drawing of a portion of yet another magnetic core assembly with emphasis on a center post showing paths of flux densities from current in a power winding in accordance with the embodiments of the present disclosure.

Modifications of the center posts of standard assemblies may introduce a transverse component of flux density to produce a voltage on a transverse winding that occupies an aperture in the center post. Examples of such modifications are shown in FIG. 13, FIG. 14, and FIG. 15. Modifications may be considered skewing features that allow a magnetic saturation detector to determine the onset of magnetic saturation by monitoring the voltage on a transverse winding in the absence of a current in a transverse winding.

FIG. 13 is an annotated perspective drawing 1300 of a portion of a magnetic core assembly with emphasis on a center post showing paths of flux densities from current in a power winding. FIG. 13 also includes a diagram illustrating the relationship between a Cartesian rectangular coordinate system using X, Y, Z coordinates and a cylindrical coordinate system using r, θ, Z coordinates. The cylindrical coordinate system may be more useful than the rectangular coordinate system to describe the salient features of the configuration shown in FIG. 13.

The center post of the structure in FIG. 13 has a rectangular cross section that rotates 180 degrees from the lower plate to the upper plate of the structure. Such a structure would have a helical reluctance path in the center section. A transverse winding 1328 passes through an aperture that is a hole through the center of the post parallel to the Z axis to produce transverse voltage $V_T$ 1130 between the ends of the winding. Coils that may form input and output power windings of either a transformer or an energy transfer element may surround the center post.

FIG. 13 shows example flux density vectors that may arise from the excitation of windings surrounding the center post. The flux density vectors may form closed paths through other portions of the structure not shown in FIG. 13, passing from the ends of the top plate to the ends of the bottom plate and returning through the center post.

The example of FIG. 13 shows two flux density vectors in the center post. A linear flux density vector $B_L$ 1339 takes a vertical path that is the shortest distance and lowest reluctance path between the bottom plate and the top plate. A helical flux density vector $B_H$ 1349 has a component in the θ direction and a component in the Z-direction as it follows a path of greater reluctance than the path of $B_L$ 1339 between the bottom plate and the top plate.

The linear flux density vector $B_L$ 1339 is expected to have a greater magnitude than the helical flux density vector $B_H$ 1349 since the magnetic reluctance is greater for the helical path than for the linear path.

Changes in the magnitude of the θ-component of the helical flux density vector in the center post produce a transverse voltage $V_T$ 1330 at the ends of the transverse winding 1328 that passes through the aperture in the center post. A change in the linear flux density vector $B_L$ 1339 does not make a significant contribution to the transverse voltage $V_T$ 1330 since the linear flux density vector $B_L$ 1339 is parallel to the transverse winding 1328 in the center post. A change in the helical flux density vector $B_H$ 1349 contributes to the voltage $V_T$ since it encircles the transverse winding 1328.

The transverse voltage $V_T$ 1330 may indicate magnetic saturation in the center post. For increasing flux in the center post, the material in the lower-reluctance linear path saturates before the material in the helical path. When saturation causes the reluctance of the linear path to increase, the flux density along the helical path increases, producing an increase in the transverse voltage $V_T$ 1330. The transverse voltage $V_T$ 1330 decreases when the helical path saturates, producing a reversal of slope in the transverse voltage $V_T$ 1330 that may be interpreted to detect magnetic saturation.

In a practical structure, the center post would have approximately twice the cross-sectional area of the top and bottom plates so that the flux density would be nearly the same through the structure. FIG. 14 is a variant of the structure of FIG. 13 with a square cross section for the center post that has approximately twice the cross-sectional area of each plate. Flux density vectors B in the top and bottom plates sum in the center post to form helical flux density vector $B_H$ 1449 and linear flux density vector $B_L$ 1439. Changes in the transverse component of helical flux density vector $B_H$ 1449 produce a transverse voltage $V_T$ 1430 at the ends of a transverse winding 1428 that may be processed and interpreted to detect magnetic saturation.

FIG. 15 is an annotated perspective drawing 1500 of a portion of yet another magnetic core assembly with emphasis on a center post showing paths of flux densities from current in a power winding. The structure illustrated in FIG. 15 has a round cylindrical center post with grooves that define a helical reluctance path. A round cylindrical center post with grooves may be a preferred feature in an assembly for a magnetic saturation detector that does not require bias current in a transverse winding.

Flux density vectors B in the top and bottom plates sum in the center post to form helical flux density vector $B_H$ 1549 and linear flux density vector $B_L$ 1539. Changes in the transverse component of helical flux density vector $B_H$ 1549 may produce a transverse voltage $V_T$ 1530 at the ends of a transverse winding 1528 that may be processed and interpreted to detect magnetic saturation. It is not necessary for the helical path to rotate multiple times around the center post as illustrated in FIG. 15. A partial rotation of the helical path about the center post may be sufficient to produce a transverse voltage $V_T$ 1530 to detect magnetic saturation.

Embodiments of the present disclosure include configurations of magnetic cores for energy transfer elements that include features for a magnetic saturation detector in which a magnetic energy transfer element includes at least one transverse winding and at least one power winding. Current in a power winding produces a magnetic flux density in the assembly. The geometry of the assembly of magnetic cores of the energy transfer element provides a path of lower magnetic reluctance for a principal component of the flux density and a path of higher magnetic reluctance for a transverse component of the flux density that is substantially perpendicular to the principal component of the flux density. A saturation detector circuit senses a voltage between terminals of the transverse winding to indicate a condition of magnetic saturation at an extremum of the time-varying voltage on the transverse winding. A bias current is not required in the transverse winding for the transverse component of the flux density to produce a voltage between the terminals of the transverse winding. In other words, configurations of magnetic cores may introduce a transverse component of flux density in the absence of current in the transverse winding such that a voltage on the transverse winding may indicate a condition of magnetic saturation.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

Although the present invention is defined in the claims, it should be understood that the present invention can alternatively be defined in accordance with the following examples:

Example 1: A magnetic core assembly comprising: a core assembly comprising, a lower core piece having a center section, and an upper core piece having a center section, the center section of the upper core piece aligned to the center section of the lower core piece such that a center post of the core assembly is formed; and a power winding, wrapped around the center post, wherein when a current is passed through the power winding a power flux density vector is generated, wherein the power flux density vector has a transverse component and a non-transverse component, and wherein the transverse component has a higher magnetic reluctance than the non-transverse component.

Example 2: The magnetic core assembly as in example 1 wherein the lower core piece comprises a lower core member; and the upper core piece comprises an upper core member.

Example 3: The magnetic core assembly as in example 2, wherein each core member has a reference mark, the reference marks are rotationally offset within the core assembly, and the rotational offset introduces the transverse component to the power flux density vector.

Example 4: The magnetic core assembly as in example 2, wherein the lower and upper core members each includes a skewing feature and a reference mark.

Example 5: The magnetic core assembly as in example 4, wherein for each core member, the skewing feature is positioned at the core member perimeter and the reference marks are aligned within the core assembly.

Example 6: The magnetic core assembly as in example 1, wherein at least one of the lower and upper core members has a skewing feature, and the skewing feature introduces the transverse component to the power flux density vector.

Example 7: The magnetic core assembly as in example 6, wherein the skewing feature is a truncated corner.

Example 8: The magnetic core assembly as in example 6, wherein the center post includes the skewing feature.

Example 9: The magnetic core assembly as in example 8, wherein the skewing feature comprises a helix.

Example 10: The magnetic core assembly as in example 8, wherein the skewing feature comprises grooves on the surface of the center post.

Example 11: A magnetic saturation detector comprising the magnetic core assembly as in example 1, the magnetic saturation detector further comprising: a transverse winding, perpendicular to the power winding, wherein transverse components from the magnetic core assembly produce a transverse voltage waveform on the transverse winding; and a voltage detection circuit, configured to receive the transverse voltage waveform and to detect a change in the sign of the slope of the transverse voltage waveform, wherein the change in the sign of the slope indicates magnetic saturation.

Example 12: The magnetic saturation detector as in example 11, wherein the center post has an aperture and the transverse winding is positioned within the aperture.

Example 13: The magnetic saturation detector as in example 12, wherein each of the lower core member and the upper core member each comprises a core member having a reference mark, wherein the reference marks are rotationally offset within the core assembly, and wherein the rotational offset introduces transverse components to the power flux density vector.

Example 14: The magnetic saturation detector as in example 12, wherein the lower core member and the upper core member, each comprises a core member having a skewing feature and a reference mark, wherein the reference marks are aligned within the core assembly, and the skewing feature introduces transverse components to the power flux density vector.

Example 15: The magnetic saturation detector as in example 14, wherein the skewing feature is positioned at the center post and is selected from a group consisting of helixes and surface grooves.

Example 16: The magnetic saturation detector as in example 14, wherein for each core member, the skewing feature is positioned at the perimeter of the core member.

Example 17: The magnetic saturation detector as in example 16, wherein the skewing feature is a truncated corner.

Example 18: A power supply that includes the magnetic saturation detector, as in example 12, comprising: an output-referenced controller, coupled to the magnetic core assembly and configured to sense an output sense signal, compare the output sense signal to a reference value, and generate a switching signal; and an input-referenced controller, coupled to the magnetic core assembly and configured to produce a drive signal.

What is claimed is:

1. A magnetic saturation detector comprising:

a magnetic core assembly comprising:

a core assembly comprising, a lower core piece having a center section, and an upper core piece having a center section, the center section of the upper core piece aligned to the center section of the lower core piece such that a center post of the core assembly is formed; and a power winding, wrapped around the center post, wherein when a current is passed through the power winding a power flux density vector is generated, wherein the power flux density vector has a transverse component and a non-transverse component, and wherein the transverse component has a higher magnetic reluctance than the non-transverse component;

a transverse winding, perpendicular to the power winding, wherein transverse components from the magnetic core assembly produce a transverse voltage waveform on the transverse winding; and a voltage detection circuit, configured to receive the transverse voltage waveform and to detect a change in the sign of the slope of the transverse voltage waveform, wherein the change in the sign of the slope indicates magnetic saturation.

2. The magnetic core assembly as in claim 1 wherein the lower core piece comprises a lower core member; and the upper core piece comprises an upper core member.

3. The magnetic core assembly as in claim 2, wherein each core member has a reference mark, the reference marks are rotationally offset within the core assembly, and the rotational offset introduces the transverse component to the power flux density vector.

4. The magnetic core assembly as in claim 2, wherein the lower and upper core members each includes a skewing feature and a reference mark.

5. The magnetic core assembly as in claim 4, wherein for each core member, the skewing feature is positioned at the core member perimeter and the reference marks are aligned within the core assembly.

6. The magnetic core assembly as in claim 1, wherein at least one of the lower and upper core members has a skewing feature, and the skewing feature introduces the transverse component to the power flux density vector.

7. The magnetic core assembly as in claim 6, wherein the skewing feature is a truncated corner.

8. The magnetic core assembly as in claim 6, wherein the center post includes the skewing feature.

9. The magnetic core assembly as in claim 8, wherein the skewing feature comprises a helix.

10. The magnetic core assembly as in claim 8, wherein the skewing feature comprises grooves on the surface of the center post.

11. The magnetic saturation detector as in claim 1, wherein the center post has an aperture and the transverse winding is positioned within the aperture.

12. The magnetic saturation detector as in claim 11, wherein each of the lower core member and the upper core member each comprises a core member having a reference mark, wherein the reference marks are rotationally offset within the core assembly, and wherein the rotational offset introduces transverse components to the power flux density vector.

13. The magnetic saturation detector as in claim 11, wherein the lower core member and the upper core member, each comprises a core member having a skewing feature and a reference mark, wherein the reference marks are aligned within the core assembly, and the skewing feature introduces transverse components to the power flux density vector.

14. The magnetic saturation detector as in claim 13, wherein the skewing feature is positioned at the center post and is selected from a group consisting of helixes and surface grooves.

15. The magnetic saturation detector as in claim 13, wherein for each core member, the skewing feature is positioned at the perimeter of the core member.

16. The magnetic saturation detector as in claim 15, wherein the skewing feature is a truncated corner.

17. A power supply that includes the magnetic saturation detector, as in claim 11, comprising:

an output-referenced controller, coupled to the magnetic core assembly and configured to sense an output sense signal, compare the output sense signal to a reference value, and generate a switching signal; and an input-referenced controller, coupled to the magnetic core assembly and configured to produce a drive signal.

* * * * *